United States Patent [19]

Koishikawa

[11] Patent Number: 5,351,162
[45] Date of Patent: Sep. 27, 1994

[54] HIGH POWER MOS DEVICE WITH PROTECTIVE CIRCUIT AGAINST OVERCURRENT OR THE LIKE

[75] Inventor: Yukimasa Koishikawa, Tokyo, Japan
[73] Assignee: NEC Corporation, Tokyo, Japan
[21] Appl. No.: 894,433
[22] Filed: Jun. 5, 1992
[30] Foreign Application Priority Data
Jun. 6, 1991 [JP] Japan .................................. 3-134546
[51] Int. Cl.$^5$ ........................ G05F 1/59; G05F 1/569; H02H 11/00
[52] U.S. Cl. .................................... 361/18; 307/39
[58] Field of Search ................. 307/354, 43, 362, 44, 307/363, 80, 364, 85, 29, 86, 39, 32; 361/18, 55-57; 323/269

[56] References Cited
U.S. PATENT DOCUMENTS

| | | | |
|---|---|---|---|
| 4,703,390 | 10/1987 | Fay et al. | 361/101 |
| 4,841,161 | 6/1989 | Lentini et al. | 307/85 |
| 5,119,262 | 6/1992 | Ikeuchi | 361/18 |

Primary Examiner—Marc S. Hoff
Assistant Examiner—Ronald W. Leja
Attorney, Agent, or Firm—Sughrue, Mion, Zinn, Macpeak & Seas

[57] ABSTRACT

This invention relates to an improvement of a high power mos device which includes a plurality of power MOSFETs whose drain regions and source regions are respectively connected in common with each other and respectively receive on-off control voltages to the respective gate regions, and circuits for generating the control voltages. When short-circuiting occurs between the gate and the source in either of these power MOSFETs, a gate current detection and interruption circuit is inserted between a control voltage source and the gate so as to interrupt the supply of the control voltage to the gate. With such an arrangement it becomes possible to dissolve adverse effect due to the short-circuiting between the gate and the source, which was not possible in the prior device of this kind, and to improve the reliability of the monolithic power MOSIC device.

6 Claims, 5 Drawing Sheets

HIGH POWER MOS DEVICE WITH PROTECTIVE CIRCUIT AGAINST OVERCURRENT OR THE LIKE

BACKGROUND OF THE INVENTION

1. Field of the Invention

The present invention relates to a high power MOS device composed of a plurality of elemental MOS FET's, and more particularly to a monolithic MOS integrated circuit for high power driving (referred to as a high power MOSIC hereinafter) of the kind equipped with protective means against abnormality condition such as overcurrent.

2. Description of the Prior Art

The high power MOSIC is being used widely for ignition control Or brake control of motor vehicles for the reason that it makes the driving and switching of a large current possible, and it is playing an important role for realization of an electronic control system of motor vehicles. A high degree of reliability is fundamentally demanded of the control system for motor vehicles in order to prevent personal accidents. Accordingly, the reliability requirement for each of the electronic components that constitute the electronic control system is severe.

While the required level of reliability is high as mentioned above, the operating environment of the high power MOSIC is a harsh one which is accompanied by variations in the operating voltage caused by electromagnetic induction, variations in the constants of the load, variations due to changes in the temperature, and the like. For these reasons, such a high power MOSIC normally has a built-in protective circuit against these various kinds of variations. Namely, such a high power MOSIC has within the IC sensors which respectively detect an overcurrent in the electronic circuit caused by a short-circuiting generated on the part of the load, an overvoltage accompanying an external electromagnetic induction, and an overheated state of the MOSIC itself, and is so constructed as to prevent the breakdown of the chip as a whole by temporarily suspending the operation of the high power part of the MOSIC in response to the output of these sensors.

The protective circuit disclosed in the specification of U.S. Pat. No. 4,703,390 entitled "Integrated Circuit Power Timer", for example, uses a power MOS FET constructed by connecting a large number of MOS FET's in parallel and detects an overcurrent with one of the large number of MOSFETs that are connected to a load in common, and prevents the breakdown of the MOSIC due to an overcurrent and an overtemperature by reflecting the allowable upper limit of the temperature of the MOSIC chip on a reference voltage which is the comparative object with the output of the MOSFET for overcurrent detection. However, in spite of the fact that such a circuit construction can appropriately detect an overcurrent that is caused by the load alone and lead to the interruption of Operation of the high power MOSFET part, the driving of the high power MOSFET part becomes impossible if a short-circuiting is generated between the gate and the source in one or several units of the parallely-connected large number of MOSFETs. As shown in the specification of the U.S. Patent, the high power MOSFET is normally constituted of parallel connection (the so-called multicell construction) of a large number of MOSFETs each of which consisting of the mutually isolated regions of source, drain and gate, instead of being constituted of a single FET. The reason for doing so is that it is effective for reducing the on-resistance by maintaining the advantages of the MOSFET, namely, a large gain, a high input impedance, facility of securing the balance in the parallel connection state, and the like. However, when a large number of gate electrodes are commonly connected with each other as described in the aforementioned U.S. Patent in order to realize the multicell structure, the on-off control of the load current becomes impossible if a short-circuity is generated between the gate and the source.

It is therefore the object of the present invention to provide a power MOS device composed of a large number of MOS FET's connected in parallel, which maintain its operation even if gate-source short-circuiting is produced in a part of the large number of MOS FET's.

It is another object of the present invention to provide a monolithic power MOSIC including a power MOSFET part of multicell structure which is substantially free from the influence of short-circuiting between the gate and the source of the power MOSFET part.

SUMMARY OF THE INVENTION

A power MOS device of the present invention is equipped with a plurality of FET cells each having a large number of parallely-connected MOSFET's the gate electrodes of the MOSFETs of the respective FET cells being connected to receive an input signal or to the output end of-a cell FET driving circuit via, instead of directly, the respective gate signal detection and interruption circuits. Accordingly, even if a short-circuiting between the gate and the source of the MOSFET of an FET cell is generated, its influence is limited to that FET cell alone without being propagated to other FET cells.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENT

Figure 1:
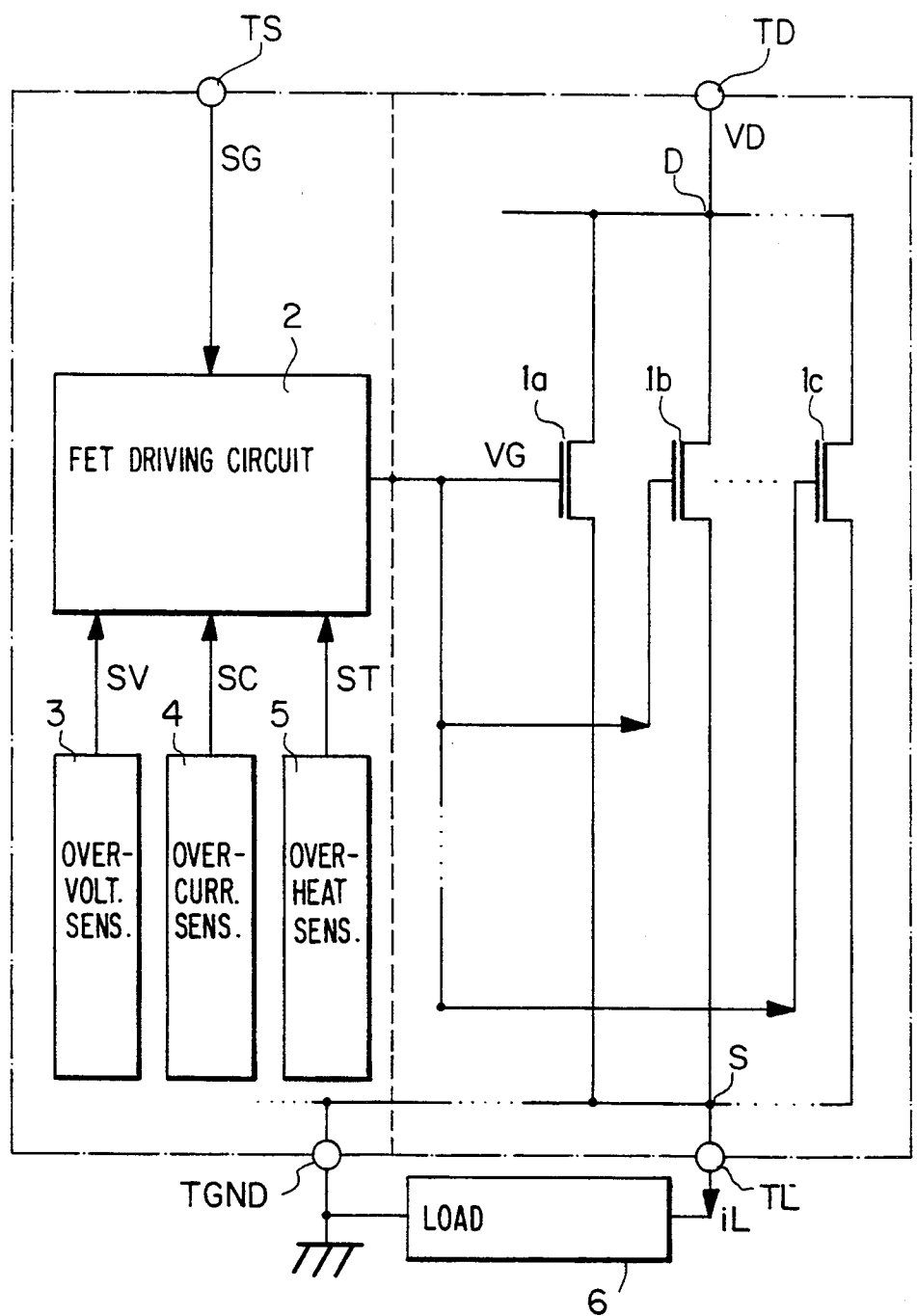
FIG. 1 is a block diagram for a high power MOSIC which includes a high power MOSFET part according to the prior art.

Referring to FIG. 1, the high power MOSIC according to the prior art shown by the block diagram in the figure, includes a plurality of cell FETs 1a, 1b, ..., and 1n with their drain regions D and the source regions S being respectively connected commonly with each other, and a cell FET driving circuit 2 which commonly controls a gate voltage VG of the cell FETs 1a, 1b, . . . , and 1n in response to a control signal SG and the sensor outputs SV, SC and ST that will be described later. The sensor outputs SV, SC and ST are supplied by an overvoltage sensor 3, an overcurrent sensor 4 and an overheat sensor 5, respectively, that are arranged respectively in the high power MOSFET part of the high power MOSIC. Further, the cell FET driving circuit 2 has a built-in charge pump for controlling the gate voltage of the cell FETs 1a to 1n. The drain region D of common connection is connected to power supply connecting terminal TD which receives the a connection of a power supply (a high electric potential source) (not shown), and analogously, the commonly connected source region S is connected to a load connecting terminal TL which receives the connection of an external load 6. Moreover, the monolithic high power MOSIC has a grounding terminal TGND which is connected to the grounding circuit (a low electric potential source) for the overall internal circuit.

This high power MOSIC controls the on and off of a current iL which is supplied to the external load 6 via the load connecting terminal TL. When the current iL becomes excessively large due to generation of a closed circuit that forms a parallel circuit with the external load 6, the overcurrent sensor 4 detects the condition and inhibits or controls the gate voltage VG by means of its sensor output SC to interrupt or control the current iL. After removal of the cause of the short circuit the sensor output SC is restored and the interruption condition of the current iL is released. When the supply voltage to the power supply connecting terminal TD is raised due, for example, to a surge voltage accompanying the electromagnetic induction from the outside, the gate voltage VG is controlled similarly by the output SV from the overvoltage sensor 3. The control of the gate voltage VG corresponding to the output ST of the overheat sensor 5 is carried out in a similar way.

With the above-mentioned construction, this high power MOSIC is capable of protecting the entirety of the MOSIC against an overvoltage, an overcurrent and an overheat states. However, if there is generated a short circuit between the gate and the source in either of the cell FETs 1a to 1n, the control of the gate voltage VG, and hence also the on-off control of the current iL, becomes impossible the driving circuit 2 output returns to the normal value as a result of the removal of the cause of the short circuit. This is because the wirings from the driving circuit 2 which supplies the gate voltage VG to the various cell FETs to the respective gates of the cell FETs 1a to 1n are connected in common with each other.

Figure 2:
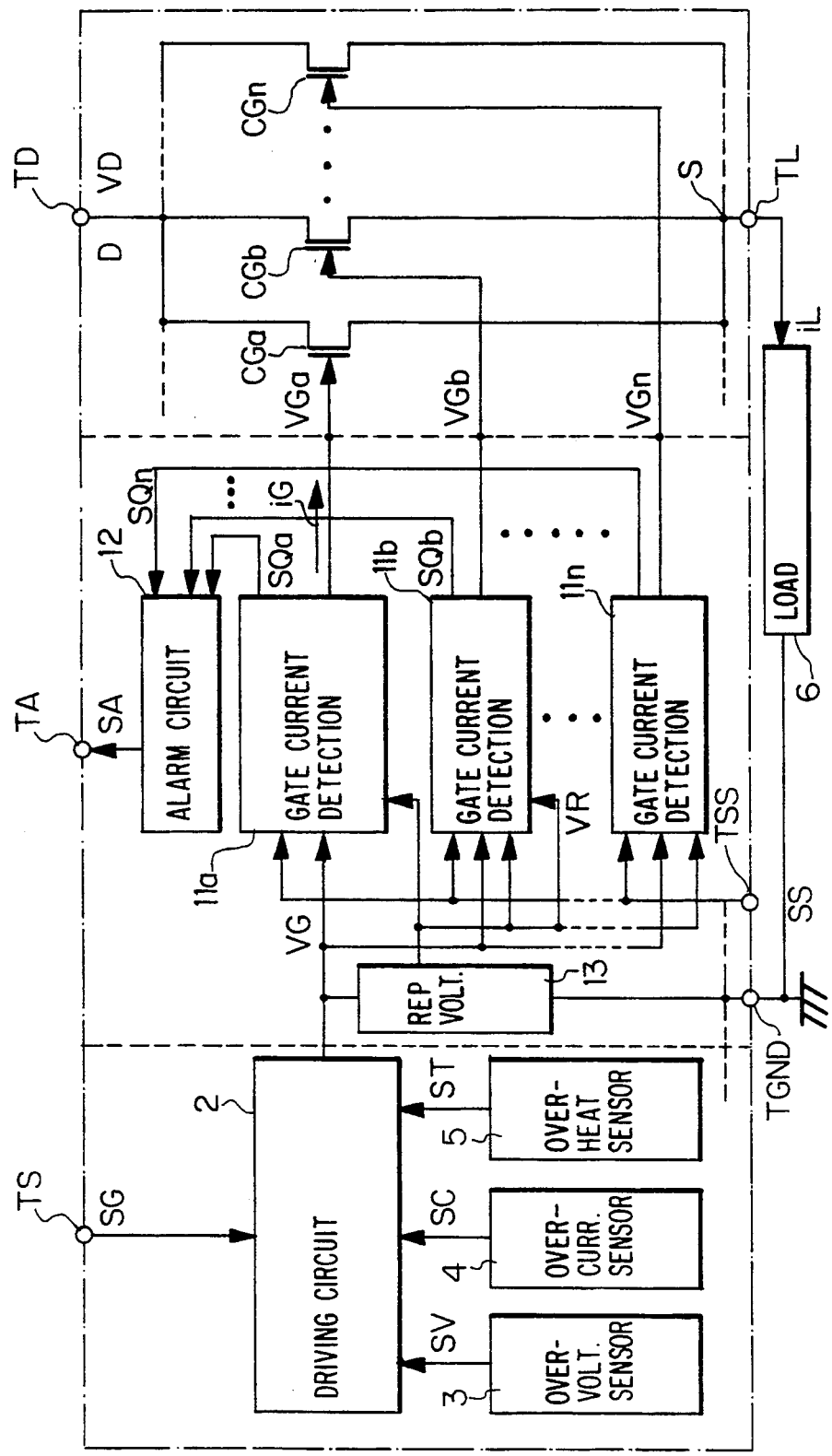
FIG. 2 is a block diagram of an embodiment of this invention.
Figure 6:
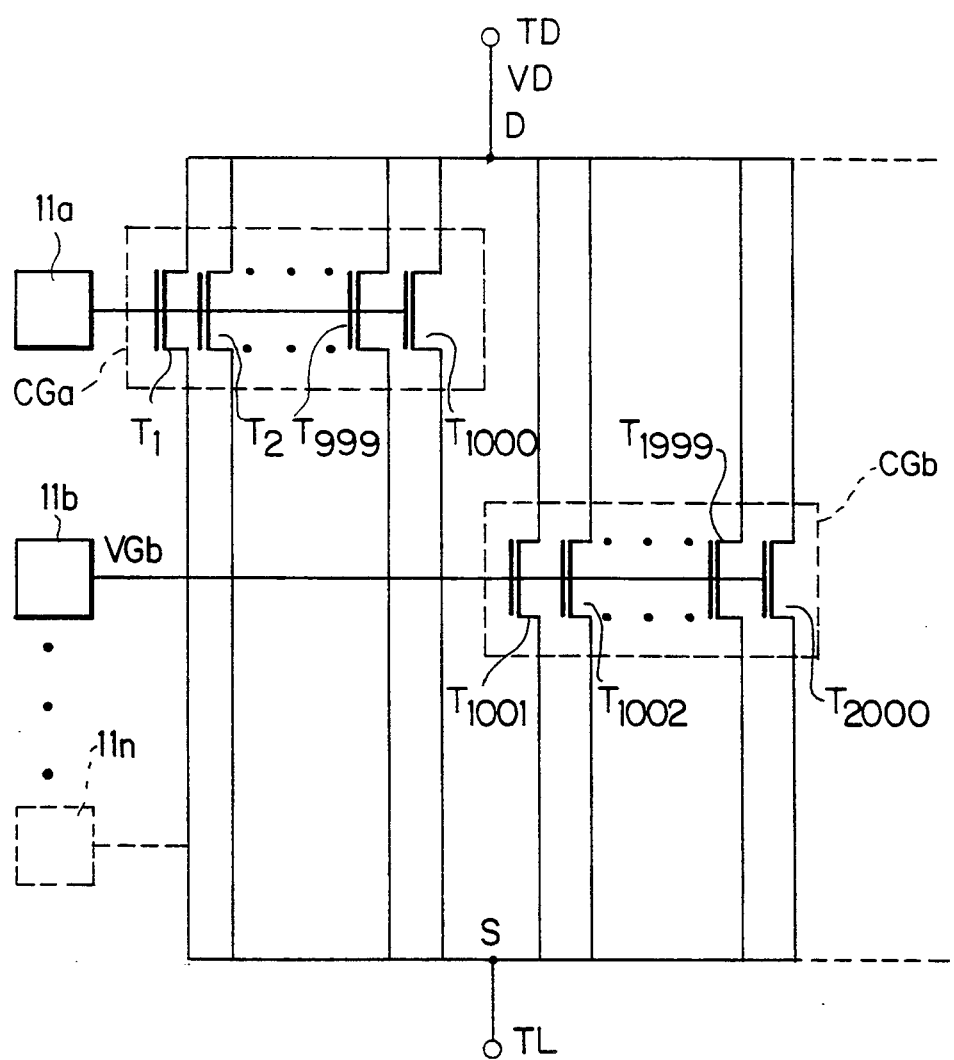
FIG. 6 is cell group circuit diagram of the embodiment.

Referring to FIG. 2, an embodiment according to this invention in which the components that are common to those in FIG. 1 are shown respectively with common reference numerals, includes gate current detection and interruption circuits 11a, 11b, . . . , and 11n that are inserted between the cell group driving circuit 2 and the gate electrodes of the cell group CGa, CGb, . . . , and CGn, respectively, and an alarm generating circuit 12 which generates an alarm signal SA at an alarm signal output terminal TA in response to the respective abnormality detection signals SQa, SQb, . . . , and SQn that are generated when these circuits 11a, 11b, . . . , and 11n, respectively, detected abnormality in the gate currents. In addition, a reference voltage source 13 which gives a reference voltage VR for comparison with the driving voltage VG (cell group driving signal) to the respective gate electrodes of the cell group CGa, CGb, . . . , and CGn is inserted between the cell group driving circuit 2 and the respective circuits 11a, 11b, . . . , and 11n. One cell group includes 1000 FETs as shown in FIG. 6 and is symbolized as one FET An FIG. 2. The reference voltage VR takes on a value which is proportional to the driving voltage VG over the period during which it is in the on-state. Moreover, a start set pulse SS from a start set pulse input terminal TS is supplied to each of these circuits 11a to 11n. In the part other than these additional components, this embodiment has a constitution common to the power MOSIC according to the prior art shown in FIG. 1.

Figure 3:
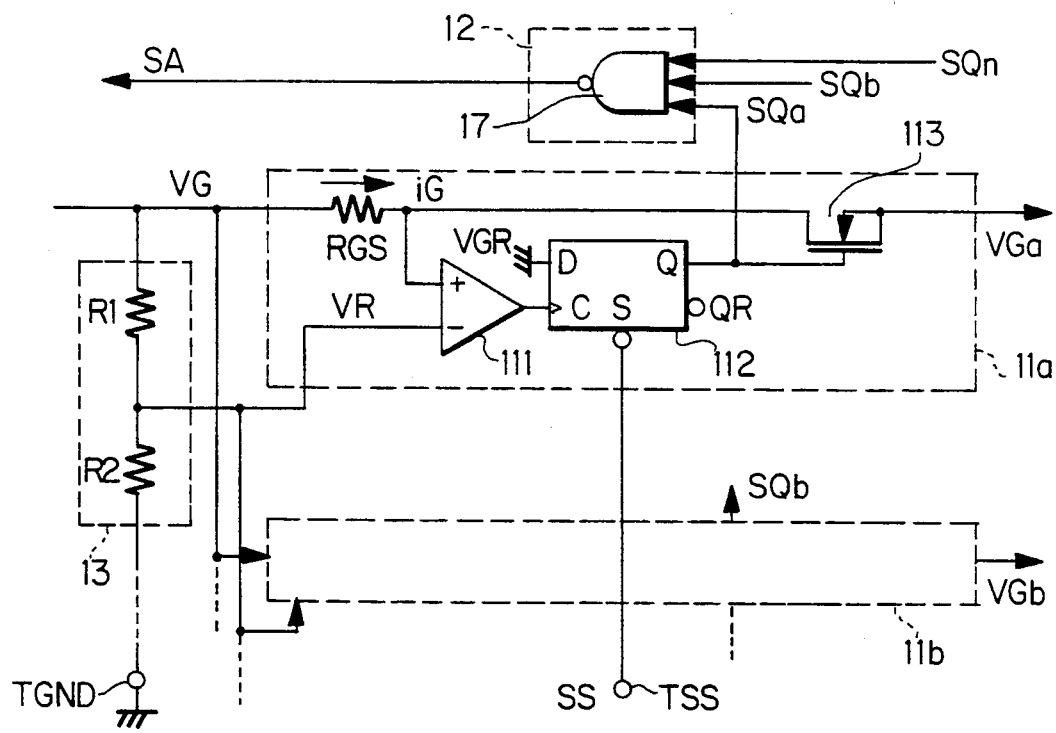
FIG. 3 is a gate signal detection and interruption circuit diagram of the embodiment.

Referring also to FIG. 3, the gate current detection and interruption circuit 11a whose detailed circuit diagram is shown in the figure as a representative of the gate current detection and interruption circuits 11a to 11n, has a comparison circuit 111 which receives the reference voltage VR from the reference voltage source 13 consisting of voltage dividing resistors R1 and R2 inserted in series between the output VG of the cell group FET driving circuit 2 and a grounding potential terminal TGND to one of the input terminals, and receives the output VG from the driving circuit 2 to the other input terminal via a serially connected resistor RGS for gate current detection, and a D-type flip-flop circuit 112 which has its Data terminal D grounded, receives the output of the circuit 111 to a clock input terminal C, and receives the start set pulse SS to the set terminal S, and a MOSFET switch 113 which receives the Q output of the flip-flop circuit 112 to the gate electrode, controls the on-off of the driving voltage VG (VGR), and generates an output VGa. The Q output of the D-type flip-flop circuit 112 is also supplied to one of the input terminals of an input NAND circuit 17 that constitutes an alarm generating circuit 12 as a signal SQa. Since each of the gate current detection and interruption circuits 11b to 11n has the same constitution as the above-mentioned circuit 11a, in FIG. 3 only the circuit 11b is shown as a broken line block, and a further illustration and description are omitted.

Figure 5:
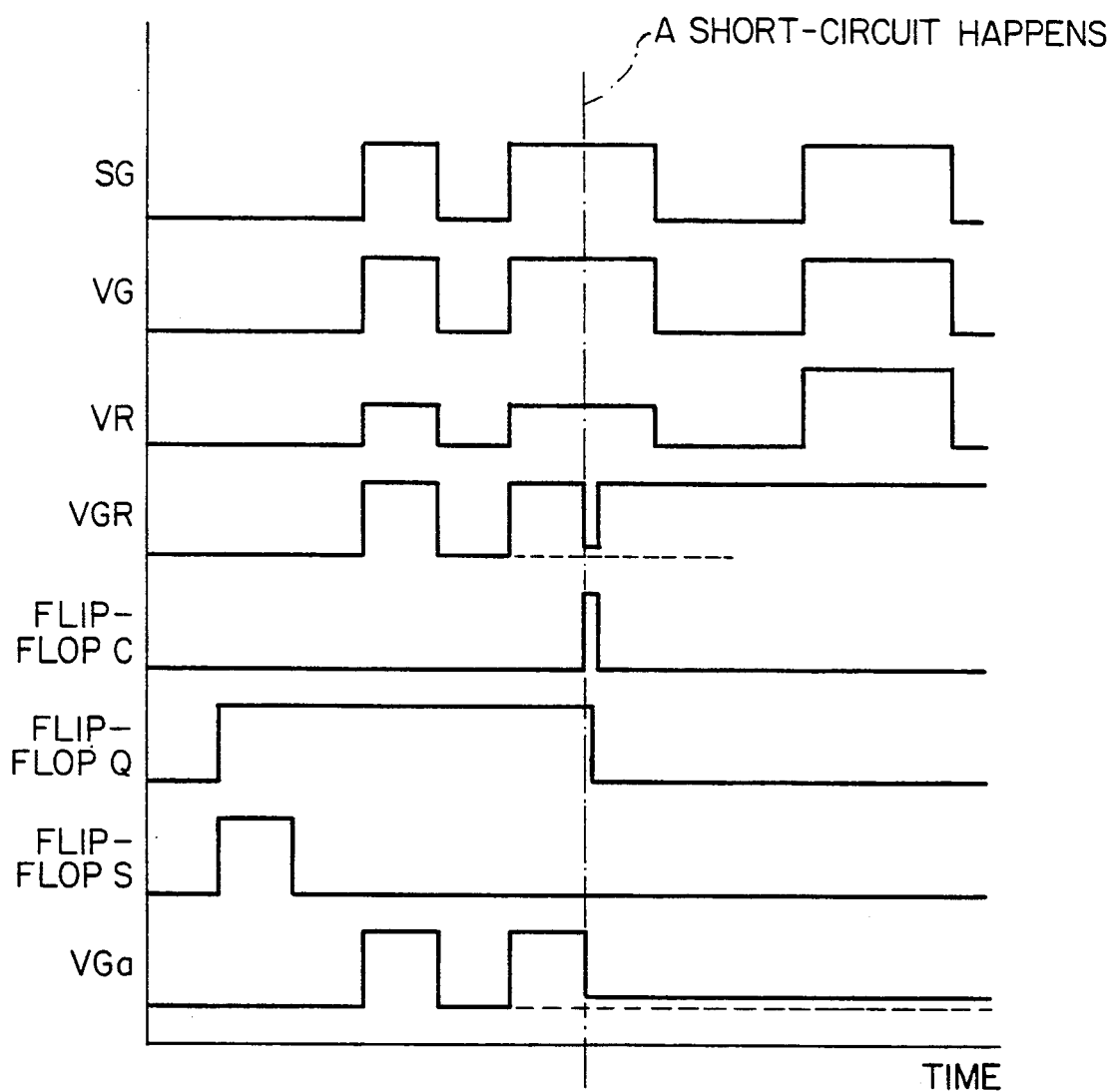
FIG. 5 is a timing chart of the embodiment.

As shown in FIGS. 2, 3, and 5, when the external load circuit 6 and the cell group CGa to CGn are operating normally, the driving voltage VG from the driving circuit 2 is applied to the MOS FET gate electrodes of the cell group CGa as the driving voltage VGa via the resistor RGS and the MOSFET switch 113 which is in the on-state, and brings the FETs of the cell group CGa to the on-state. On the other hand, the D-type flip-flop circuit 112 in this state is previously set to the set-state by the start set pulse SS to the flip-flop S, and the signal SQa from the terminal Q is at a high level. Moreover, in the case of the above-mentioned normal operation, a driving voltage VGR supplied to the "positive" input terminal of the comparator circuit 111 is invariably higher than the reference voltage VR supplied to the "negative" input terminal. As long as the normally operating state lasts the MOSFET switch 113 connects the on-state by the output SQa from the Q output terminal of the D-type flip-flop 112, and the protective operation of this embodiment follows the control by the sensors 3, 4 and 5 similar to the prior art shown in FIG. 1.

Next, as shown in FIGS. 2, 3, and 5, when short circuit between the gate and the source exists in one of the FETs in the cell groups CGa to CGn, a gate current iG flows through the short-circuited part between the gate and the source on the next application of the driving voltage VG. Then, a voltage drop is generated across the series resistor RGS due to the gate current, and as a result, the voltage of the "positive" input terminal of the comparator circuit 111 becomes smaller than the reference voltage VR. Accordingly, the output of the comparator circuit 111 goes to a low level, and the output signal SQa of the Q output terminal of the D-type flip-flop circuit 112 goes to the low level. As a result, the MOSFET switch 113 goes to the off-state and the gate current iG is interrupted, and an alarm signal SA is generated from the NAND circuit 17. Since the condition of the D-type flip-flop circuit 112 is unaltered, the FET switch 113 remains in the off-state. On the other hand, the gate current detection and interruption circuits 11b to 11n connected respectively to the cell group CGb to CGn supply the driving voltages VGb to VGn to the corresponding cell groups, and maintain these cell group FETs in the on-state. As a result, the current IL to the external load 6 is shared among the cell groups CGb to CGn, with the corresponding increases in the share of these cell group FETs, but there will arise an overload state to none of FETs of the cell group CGb to CGn. Moreover, the maintenance and repair becomes possible due to the generation of the alarm signal SA so that even if an overloaded condition is generated, its influence can be dissolved in a short time.

Figure 4:
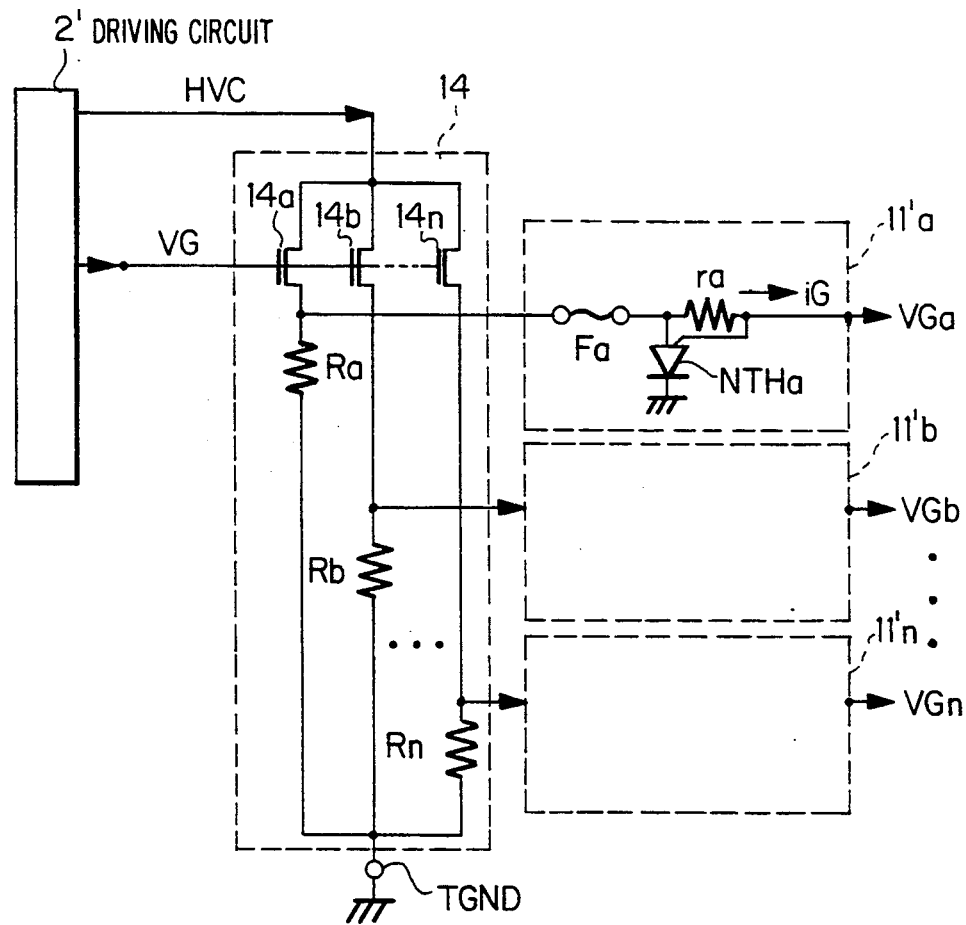
FIG. 4 is a circuit diagram which is a modification of the part corresponding to FIG. 3.

Next, referring to FIG. 4 which shows a circuit diagram for a modification of the current detection and interruption circuit 11a shown in FIG. 3, a cell group driving circuit 2' generates, corresponding to this modification, a high voltage auxiliary driving output HVC due to a built-in charge pump circuit along with the driving voltage VG. The auxiliary driving output HVC is supplied to the commonly connected drain electrodes of FETs 14a, 14b, . . . , and 14n of source-follower connections whose source electrodes are connected to the grounding terminal TGND through the respective resistors Ra, Rb, . . . , and Rn and commonly receive the voltage VG to their gate electrodes. A circuit 11'a which is a representative of gate current detection and interruption circuits 11'a, 11'b, . . . , and 11'n which respectively receive the output voltages from the source electrode terminals of the FETs 14a, 14b, . . . , and 14n, includes a semiconductor fuse Fa and a resistor ra that are mutually connected in series, and an N-gate thyristor NTHa whose cathode is connected to the grounding potential and whose anode and control electrode are connected to the terminals on the fuse Fa side and the output side, respectively, of the resistor ra. A description of the corresponding outputs or the like of the circuits 11'b to 11'n is omitted by simply indicating in FIG. 4 the replacement of the symbol a of the circuit 11'a by the symbols b to n.

If a gate current iG flows in the cell FET 11'i a due to short-circuiting generated between the gate and the source in the on-state of the driving voltage VG, the thyristor NTHa is turned on due to voltage drop across the resistor ra, the voltage at the junction between the fuse and the resistor ra becomes equal to the grounding potential so that the fuse Fa is melted owing to the voltage supplied by the source-follower 14a. As a result, the supply of the driving voltage VG to the gate electrode of the cell FET 1a is interrupted. That the current iL supplied to the external load 6 is shared with the cell FETs 1b to 1n after the circuit 11'a is brought to an interrupted state in this manner is similar to the case of the circuit in FIG. 3. In the modification shown in FIG. 4 of the embodiment of this invention the overall circuit construction can be simplified since the level of the gate current is detected by the N-gate thyristor and the melted state of the semiconductor fuse is maintained.

Although the invention has been described with reference to a specific embodiment, this description is not meant to be construed in a limiting sense. Various modifications of the disclosed embodiment will become apparent to persons skilled in the art upon reference to the description of the invention. It is therefore contemplated that the appended claims will cover any modifications or embodiments as fall within the true scope of the invention.

I claim:

1. A power MOS device comprising a plurality of MOS transistors each having a first electrode serving as one of source and drain thereof and connected to a first terminal, a second electrode serving as the other of said source and drain and connected to a second terminal and a gate electrode, a drive circuit producing a drive signal at an output node thereof, said drive signal having a first level that renders each of said MOS transistors conductive and a second level that renders each of said MOS transistors nonconductive, and a plurality of current detection and interrupt circuits each connected between said output node of said drive circuit and said gate electrode of an associated one of said MOS transistors, each of said current detection and interrupt circuits including a resistor inserted in series into a signal path for transferring said drive signal from said output node of said drive circuit to said gate electrode of said associated one of said MOS transistors, detection means coupled to said resistor and responsive to a voltage produced by said resistor for detecting whether or not a current due to a short circuit between said gate and first electrodes of said associated one of said MOS transistors flows through said resistor, and interrupt means coupled to said detection means for preventing said drive signal from being transferred from said output node of said drive circuit to said gate electrode of said associated one of said MOS transistors when said detection means detects that said current due to said short circuit flows through said resistor, said associated one of said MOS transistors being thereby kept into a nonconductive state irrespective of said drive signal.

2. The device as claimed in claim 1, wherein said detection means includes a comparator having a first input end supplied with said voltage produced by said resistor and a second input end supplied with a reference voltage, said comparator producing a detection signal at an output end thereof when said voltage produced by said resistor exceeds said reference voltage caused by a fact that said current due to said short circuit flows through said resistor, and said interrupt means includes a transistor switch inserted in series into said signal path between said resistor and said gate electrode of said associated one of said MOS transistors and a control circuit responding to said detection signal from said comparator to turn said transistor switch OFF so that said drive signal is prevented from being transferred to said gate electrode.

3. The device as claimed in claim 2, wherein said reference voltage is produced by a resistor-dividing circuit connected to said output node of said drive circuit so that said reference voltage is derived by resistor-dividing said first level of said drive signal by said resistor-dividing circuit.

4. The device as claimed in claim 2, wherein said control circuit comprises a flip-flop having a clock terminal connected to said output end of said comparator, a data terminal supplied with a control level that turns said transistor switch OFF and an output terminal connected to said transistor switch, said flip-flop transfers said control level from said data terminal to said output terminal when said flip-flop receives said detection signal at said clock terminal to thereby turn said transistor switch OFF, said flip-flop further having a set terminal operatively supplied with a set signal and changing said output terminal to such a level that turns said transistor switch ON when said set signal is supplied to said set terminal.

5. The device as claimed in claim 1, wherein said detection means includes a thyristor having a control electrode and an anode electrode connected respectively to first and second ends of said resistor, said thyristor being tuned ON by the voltage drop across said resistor caused by a fact that said current due to said short circuit flows through said resistor, and said interrupt means includes a fuse inserted in series into said signal path between said output node of said drive circuit and said resistor, said fuse is blown when said thyristor is turned ON to thereby prevent said drive signal from being transferred to said gate electrode.

6. The device as claimed in claim 5, each of said current detection and interrupt circuits further includes a source-follower transistor having a gate connected to said output node of said drive circuit and a source connected to said fuse.

* * * * *

UNITED STATES PATENT AND TRADEMARK OFFICE
CERTIFICATE OF CORRECTION

PATENT NO. : 5,351,162
DATED : September 27, 1994
INVENTOR(S) : Koishikawa

It is certified that error appears in the above-indentified patent and that said Letters Patent is hereby corrected as shown below:

Col. 1, line 17, delete "Or" and insert --or--.

Col. 4, line 4, delete "An" and insert --in--.

Col. 5, line 53, delete "11'i a" and insert --11'a--.

Signed and Sealed this

Seventh Day of February, 1995

Attest:

BRUCE LEHMAN

*Attesting Officer*     *Commissioner of Patents and Trademarks*